(12) United States Patent
Koppitsch et al.

(10) Patent No.: US 10,062,610 B2
(45) Date of Patent: Aug. 28, 2018

(54) METHOD OF PRODUCING AN OPENING WITH SMOOTH VERTICAL SIDEWALL IN A SEMICONDUCTOR SUBSTRATE

(71) Applicant: ams AG, Unterpremstaetten (AT)

(72) Inventors: Guenther Koppitsch, Lieboch (AT); Bernhard Loeffler, Gleisdorf (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/520,821

(22) PCT Filed: Oct. 15, 2015

(86) PCT No.: PCT/EP2015/073923
§ 371 (c)(1),
(2) Date: Apr. 20, 2017

(87) PCT Pub. No.: WO2016/062614
PCT Pub. Date: Apr. 28, 2016

(65) Prior Publication Data
US 2017/0316976 A1    Nov. 2, 2017

(30) Foreign Application Priority Data
Oct. 21, 2014  (EP) .................................. 14189757

(51) Int. Cl.
*H01L 21/00* (2006.01)
*H01L 21/768* (2006.01)
*H01L 23/48* (2006.01)
*H01L 21/3065* (2006.01)

(52) U.S. Cl.
CPC .. *H01L 21/76898* (2013.01); *H01L 21/30655* (2013.01); *H01L 23/481* (2013.01)

(58) Field of Classification Search
CPC ......... H01L 21/76898; H01L 21/30655; H01L 23/481
See application file for complete search history.

(56) References Cited

U.S. PATENT DOCUMENTS

| 5,501,893 A | 3/1996 | Laermer et al. |
| 2008/0023846 A1 | 1/2008 | Seki et al. |
| 2009/0242512 A1 | 10/2009 | Beaudry |

FOREIGN PATENT DOCUMENTS

| EP | 2077577 A1 | 7/2009 |
| WO | 2012031845 A1 | 3/2012 |
| WO | 2014090681 A1 | 6/2014 |

*Primary Examiner* — Richard Booth
(74) *Attorney, Agent, or Firm* — McDermott Will & Emery LLP

(57) ABSTRACT

An opening (17) is etched from a main surface (10) of a substrate (1) of semiconductor material by deep reactive ion etching comprising a plurality of cycles, each of the cycles including a deposition of a passivation in the opening and an application of an etchant. An additional etching is performed between two consecutive cycles by an application of a further etchant that is different from the etchant. The passivation layer (9) is thus etched above a sidewall (7) of the opening to remove undesired protrusions.

10 Claims, 2 Drawing Sheets

METHOD OF PRODUCING AN OPENING WITH SMOOTH VERTICAL SIDEWALL IN A SEMICONDUCTOR SUBSTRATE

BACKGROUND OF THE INVENTION

The invention relates to the field of semiconductor process technology and in particular to the production of through-substrate vias (TSVs) using DRIE (Deep Reactive Ion Etching). TSVs provide electric interconnections between opposite main sides of a semiconductor device and are useful for many applications, especially in three-dimensional integration of integrated circuits, for example.

WO 2012/031845 A1 discloses a manufacturing method for semiconductor devices comprising a through-substrate via. A contact hole is formed through the intermetal dielectric and the semiconductor material of the substrate, and a contact area of a metal plane that faces the substrate is exposed in the contact hole. A metallization is applied to form a contact on the contact area and an interconnection penetrating the substrate to contact an opposite further contact area facing away from the substrate.

U.S. Pat. No. 5,501,893 A discloses a method of anisotropically etching silicon to provide laterally defined recess structures. Silicon is removed by plasma etching using a reactive etching gas. A polymer former contained in the plasma is then used to generate a polymer layer on the etched surface, which inhibits the etching process until the polymer is removed. The etching step and the polymerizing step are alternatingly repeated. This method is generally known in the art as Bosch process, after the assignee of the patent, and is also known as pulsed or time-multiplexed etching.

In the Bosch process a standard, essentially isotropic plasma etching is performed to etch a deep opening in silicon. The plasma may comprise $SF_6$, sulfur hexafluoride, for instance. After a few seconds of etching, a chemically inert passivation layer is formed to protect the silicon surface from further attack, thus inhibiting further etching. The passivation layer is typically formed from a polymer former contained in the plasma and may comprise $C_4F_8$, octafluorocyclobutane, for instance. In a subsequent anisotropic etching step, the passivation layer is removed from the bottom of the opening while remaining on the sidewall, so that only the bottom of the opening is subsequently again exposed to the etchant.

The etching and polymerizing steps are alternatingly repeated, so that many small isotropic etching steps are performed, which yield an overall deep anisotropic etching. To etch through a 0.5 mm silicon wafer, for example, 100 to 1000 cycles of etching and polymerizing are performed. The sequence of polymer layers formed on the sidewall during consecutive etching and passivating cycles renders the sidewall undulated. When etching is completed, the sidewall of the opening comprises striations and a typical roughness. The cycle time can be adjusted: short cycles yield smoother walls, and long cycles yield a higher etch rate.

SUMMARY OF THE INVENTION

The method of producing an opening in a semiconductor substrate comprises providing a substrate of semiconductor material having a main surface, forming an opening in the substrate from the main surface by deep reactive ion etching comprising a plurality of cycles, each of the cycles including a deposition of a passivation forming a passivation layer in the opening and an application of an etchant, and performing an additional etching between two consecutive cycles of the plurality of cycles by an application of a further etchant that is different from the etchant, whereby the passivation layer is etched on a sidewall of the opening.

In a variant of the method, the passivation layer is removed from the sidewall of the opening.

In further variants of the method, the additional etching is performed after at least one hundred or at least two hundred cycles of the plurality of cycles and before at least one hundred further cycles of the plurality of cycles.

In a further variant of the method, the additional etching is performed after at least half (50%) of an intended depth of the opening has been etched.

In a further variant of the method, the additional etching is performed after at least three fifths (60%) of the intended depth of the opening have been etched and before four fifths (80%) of the intended depth of the opening have been etched.

In a further variant of the method, an oxygen plasma is employed in the additional etching.

In a further variant of the method, the additional etching is isotropic.

In further variants of the method, the additional etching is performed to have a duration that is at least three times or at least five times the duration of one of the cycles.

In a further variant of the method, the passivation layer is formed by polymerization.

In a further variant of the method, at least one further additional etching is performed between two further consecutive cycles of the plurality of cycles by a further application of the further etchant.

In a further variant of the method, at least fifty cycles of the plurality of cycles are performed between the additional etching and the further additional etching.

In a further variant of the method, a second further additional etching is performed. In particular, exactly three additional etching steps including an application of a further etchant may be performed during the entire etching process. The additional etching steps are separated from one another by an appropriate number of cycles of the plurality of cycles.

In a further variant of the method, at least three hundred cycles are performed.

In a further variant of the method, the opening is etched as a through-substrate via penetrating the substrate.

In a further variant of the method, a metallization layer is arranged in the opening.

The following is a detailed description of examples of the method.

DETAILED DESCRIPTION

Figure 1:
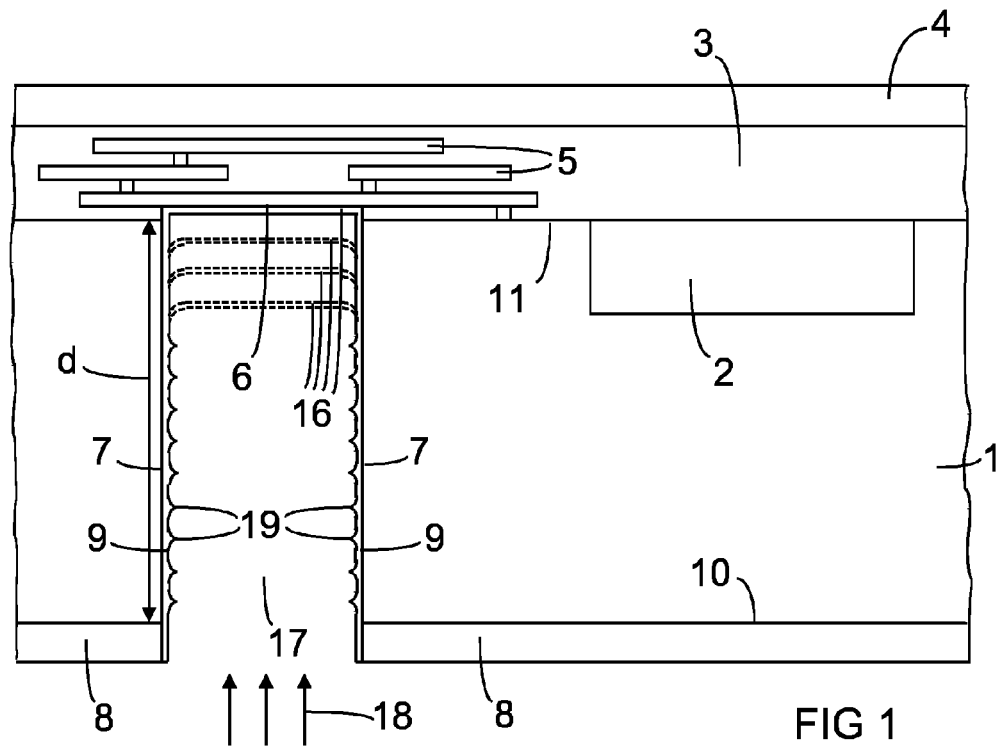
FIG. 1 is a cross section of a semiconductor substrate provided with an opening by DRIE.

DRIE is liable to generate an undulation on the sidewall of the etched opening as well as vertical striations and etching defects that may appropriately be designated as "pocketing". It has been found that such etching defects may cause electrical shorts or a rise in leakage currents occurring in a device comprising a through-substrate via formed by DRIE.

The etching defects may build up from vertical striations during several cycles of etching and passivating, especially passivating by polymerization. When the striations reach a certain size, the deposition of polymer and hence the thickness of the passivation layer increase until the isotropic etching does no longer suffice to remove the added polymer. As a consequence, tile-shaped overhangs are formed, which shadow lateral portions of the striations from further deposition and thus generate an area of reduced resistance to the subsequent isotropic etching step. At a certain stage, a tiny pocket will be excavated at these locations, and a side track begins to form in the semiconductor material. The side track remains in the semiconductor material for the rest of the process and eventually forms a "pocketing" site.

The method of producing an opening with smooth vertical sidewall in a semiconductor substrate aims at reducing the sidewall defects resulting from an anisotropic DRIE process. To this end, the sequence of cycles of etching and passivating is interrupted at least once, and an additional etching step with high selectivity to the semiconductor material, in particular silicon, is performed to remove at least a surface layer portion of the passivation layer from above the sidewall of the etched opening. After the additional etching, the main process is resumed with a succession of further cycles.

The intermediate additional etching step may have a duration that is typically about five times as long as the duration of one of the regular cycles comprising etching and passivating. If the etching parameters are accordingly adjusted, it may suffice if the duration of the additional etching step is at least three times as long as the duration of one of the regular cycles of etching and passivating. The additional etching step is performed using a different etchant and may in particular employ an oxygen plasma, for example, with the process parameters set for an isotropic removal of at least a portion of the passivation layer, which may be a polymer, for instance.

Semiconductor devices produced by the described method have been found to exhibit an improved yield of 97.8%. A DRIE process using this method for the production of through-substrate vias having a depth of 200 μm and a width of 80 μm may typically comprise a total of 340 cycles. Every cycle consists of three consecutive steps: polymer deposition for 1.0 sec, anisotropic polymer etching for 1.1 sec, and isotropic silicon etching for 2.0 sec. The polymer forms a passivation layer. An intermediate isotropic polymer etching for about 15 sec may be performed immediately after the 200th cycle and the 290th cycle, for example. The impact of the additional etching steps is discernible in the roughness pattern of the sidewall.

FIG. 1 is a cross section of a semiconductor substrate 1, which may be silicon, for instance. The substrate 1 may be provided with an integrated circuit 2 and a wiring comprising an intermetal dielectric 3, an upper passivation layer 4 and interconnected wiring layers 5 embedded in the intermetal dielectric 3. A through-substrate via may be provided to connect a contact area 6 of the wiring with an electric conductor arranged on the opposite side. An opening 17 for the via is etched into the substrate 1 from a main surface 10 in the direction towards an opposite further main surface 11 of the substrate 1. Hence, in this example, the intended depth d of the opening 17 corresponds to a complete penetration of the substrate 1. Other depths d of the opening 17 may be suitable for other embodiments. In the embodiment shown in FIG. 1, the wiring is arranged above the further main surface 11, but the arrangement may be different. When the opening 17 uncovers the contact area 6, a metallization can be applied to the contact area 6 and the sidewall 7 of the opening 17 to form an electric interconnection through the substrate 1.

For the purpose of producing the opening 17, plasma etching is performed to form a recess in the substrate 1. An etchant is used that is suitable to etch the semiconductor material. Sulfur hexafluoride can be used to etch silicon, for instance. A mask 8, which may be a structured resist, for instance, is applied at or above the main surface 10 and allows the etchant to attack the semiconductor material at the location where the opening 17 is to be formed. The etching may be essentially isotropic. In FIG. 1, the vertical etch attack, which increases the depth of the etched recess, is indicated by arrows as a vertical direction 18.

In each cycle of the etching process, a thin passivation is formed, typically by polymerization generated by a polymer former provided in the plasma, for instance. The passivation interrupts the etching process until at least a bottom layer 16 of the passivation has been removed by an essentially anisotropic etching. When the semiconductor material of the substrate 1 has been uncovered at the bottom of the recess or partial opening 17, the etchant attacks the semiconductor material again, and the recess is etched deeper.

Figure 3:
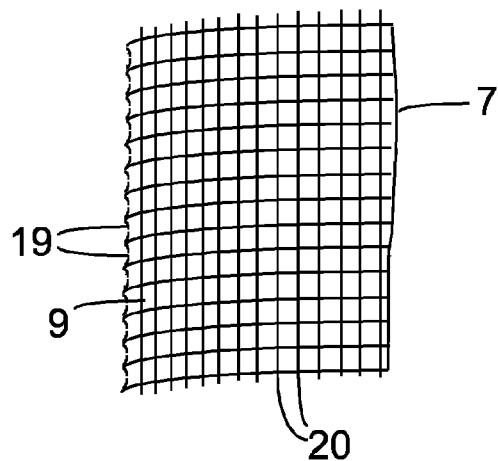
FIG. 3 shows a section of a sidewall of the etched opening.

The complete opening 17 is formed by reiterating the cycle of passivating and etching. In the course of repetition of the cycles, passivating bottom layers 16 are formed at decreasing distances from the further main surface 11 or from the contact area 6, respectively, as indicated in FIG. 1 with dotted contours. A passivation layer 9 is eventually formed on the entire sidewall 7 of the etched opening 17. Corrugations 19 formed on the surface of the passivation layer 9 by the cycles of passivating and etching are schematically indicated in FIG. 1. The arrangement of the corrugations 19 and vertical striations 20, which allow the etching defects to build up on the sidewall 7 of the opening 17, are schematically illustrated in FIG. 3.

The additional etching is performed to remove the described etching defects on the sidewall 7 of the opening 17. Thereby the passivation layer 9 is thinned and optionally removed from the sidewall 7. The effect of "pocketing" can thus be eliminated or at least reduced.

Figure 2:
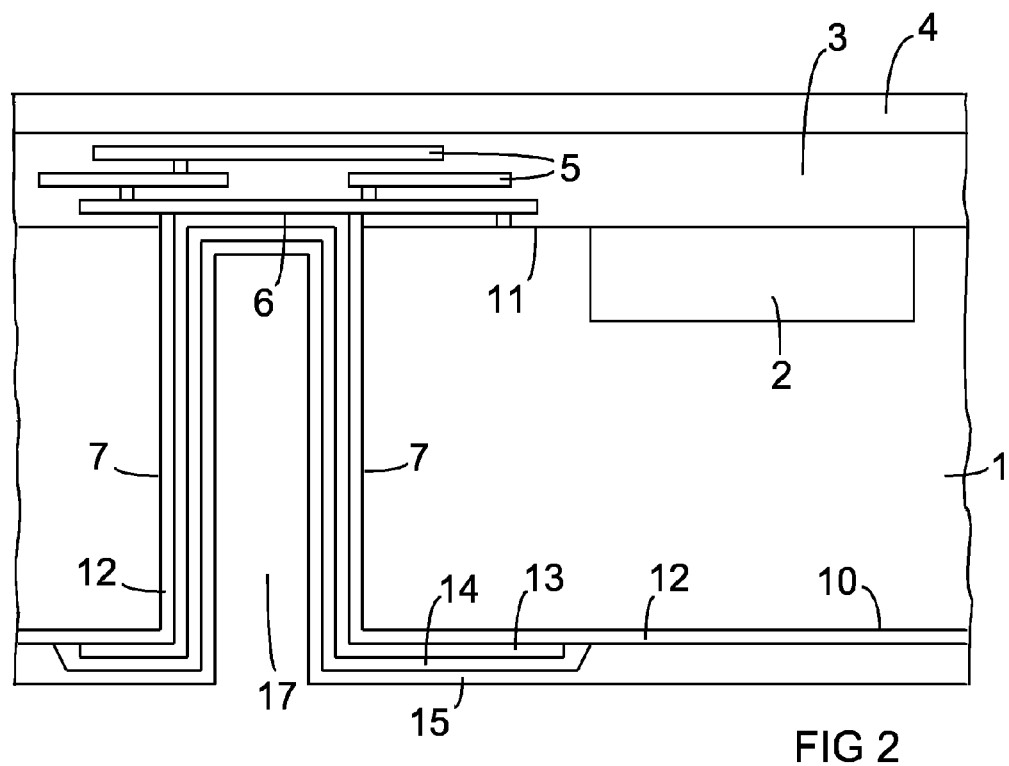
FIG. 2 is a cross section according to FIG. 1 after the formation of a through-substrate via.

FIG. 2 shows a cross section according to FIG. 1 after the formation of a through-substrate via by application of a dielectric layer 12 on the bare semiconductor material of the substrate 1, a metallization layer 13 contacting the contact area 6, a further dielectric layer 14 on the metallization 13, and an optional rear passivation layer 15, by way of example. Conductor tracks can be formed above the main surface 10 by the metallization layer 13 or by a structured further metallization. Thus the wiring can be connected with an electric terminal on the opposite side of the semiconductor device.

Figure 4:
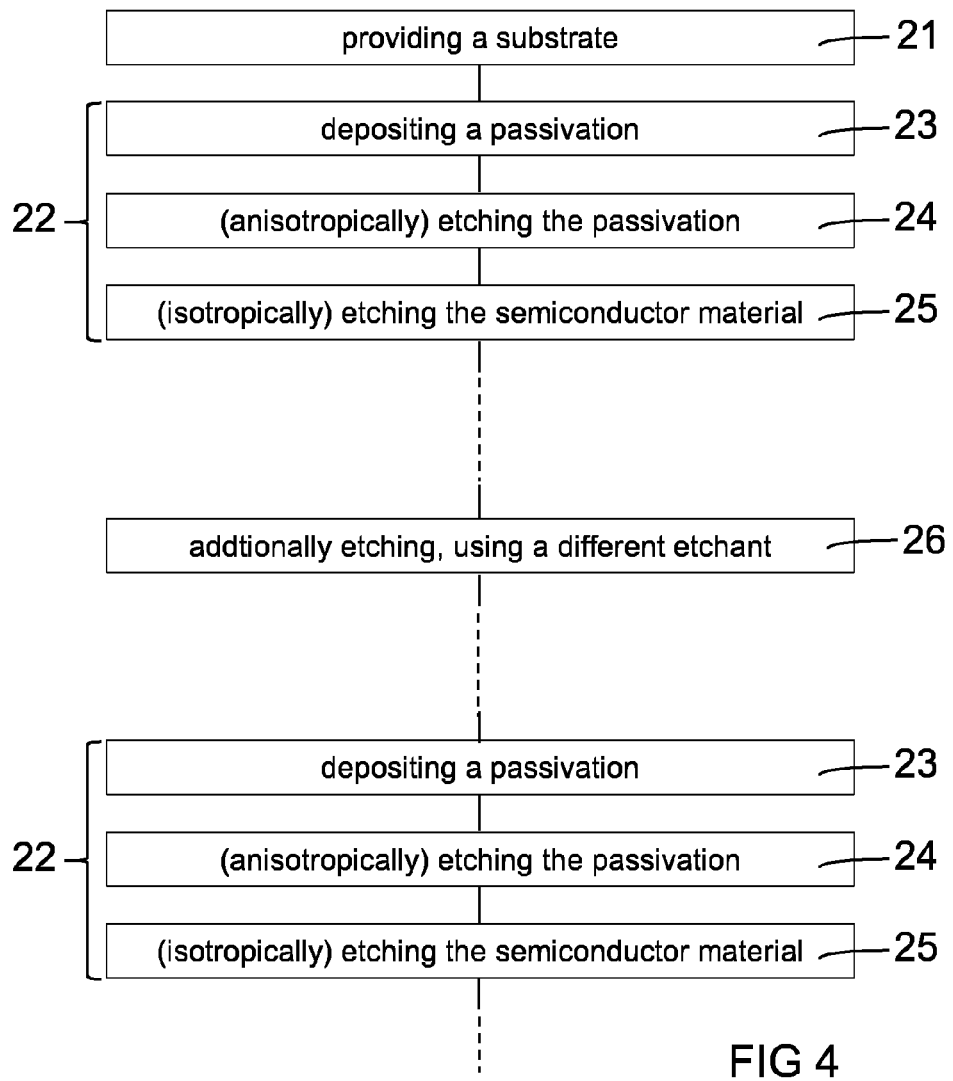
FIG. 4 is a flow chart of the method.

FIG. 4 shows a flow chart of the method step of providing a substrate 21, the cycles 22 of method steps including a method step of depositing 23 a passivation layer, a method step of etching 24 the passivation layer, which may be performed anisotropically, and a method step of etching 25 the semiconductor material, which may be performed isotropically. Between these cycles 22, the method step of applying 26 a different etchant is introduced.

Owing to one or several additional etching steps, the DRIE process yields a through-substrate via having a comparatively smooth sidewall. The occurrence of leakage currents is thus avoided or at least drastically reduced.

Further to an opening intended for a through-substrate via, the described method can favorably be applied to produce any deep openings in a semiconductor body or substrate whenever relatively smooth vertical sidewalls are required. The method is facilitated by performing the additional etching in the equipment used for the etching and passivating cycles.

The invention claimed is:

1. A method of producing an opening in a semiconductor substrate, comprising:
    providing a substrate of semiconductor material having a main surface;
    forming an opening in the substrate from the main surface by deep reactive ion etching comprising a plurality of cycles, each of the cycles consisting of three consecutive steps: polymer deposition, anisotropic polymer etching and isotropic silicon etching; and
    performing an isotropic additional etching between two consecutive cycles of the plurality of cycles by an application of a further etchant that is different from the etchant, whereby a passivation layer is etched on a sidewall of the opening.

2. The method of claim 1, wherein the passivation layer is removed from the sidewall of the opening.

3. The method of claim 1, wherein the additional etching is performed after at least half of an intended depth of the opening has been etched.

4. The method of claim 1, wherein the additional etching is performed after at least three fifths of the intended depth of the opening have been etched and before four fifths of the intended depth have been etched.

5. The method of claim 1, further comprising:
    an oxygen plasma being employed in the additional etching.

6. The method of claim 1, wherein the additional etching is performed to have a duration that is at least three times a duration of one of the cycles.

7. The method of claim 6, wherein the duration of the additional etching is at least five times the duration of one of the cycles.

8. The method of claim 1, further comprising:
    the passivation layer being formed by polymerization.

9. The method of claim 1, further comprising:
    at least one further additional etching being performed between two further consecutive cycles of the plurality of cycles by a further application of the further etchant.

10. The method of claim 9, wherein at least fifty cycles of the plurality of cycles are performed between the additional etching and the further additional etching.

* * * * *